United States Patent
Yang et al.

(10) Patent No.: US 8,692,300 B2
(45) Date of Patent: Apr. 8, 2014

(54) INTERPOSER AND METHOD FOR FORMING THE SAME

(76) Inventors: Ming-Kun Yang, Pingzhen (TW); Tsang-Yu Liu, Zhubei (TW); Yen-Shih Ho, Kaohsiung (TW)

( * ) Notice: Subject to any disclaimer, the term of this patent is extended or adjusted under 35 U.S.C. 154(b) by 70 days.

(21) Appl. No.: 13/360,435

(22) Filed: Jan. 27, 2012

(65) Prior Publication Data

US 2012/0193811 A1    Aug. 2, 2012

Related U.S. Application Data

(60) Provisional application No. 61/438,145, filed on Jan. 31, 2011.

(51) Int. Cl.
*H01L 29/40* (2006.01)
*H01L 23/492* (2006.01)

(52) U.S. Cl.
CPC .................................... *H01L 23/492* (2013.01)
USPC .................................. 257/261; 257/E23.174

(58) Field of Classification Search
CPC ................................................... H01L 23/492
USPC .......................................... 257/621, E23.174
See application file for complete search history.

(56) References Cited

U.S. PATENT DOCUMENTS 8,035,198 B2 *  10/2011  Ding et al. ..................... 257/621
2012/0261830 A1 *  10/2012  Chu et al. ...................... 257/774

* cited by examiner

*Primary Examiner* — William D Coleman
(74) *Attorney, Agent, or Firm* — Liu & Liu

(57) ABSTRACT

An embodiment of the invention provides an interposer which includes: a substrate having a first surface and a second surface; a first hole extending from the first surface towards the second surface; a second hole extending from the first surface towards the second surface, wherein a width of the first hole is different from a width of the second hole; an insulating layer located on the substrate and extending onto a sidewall of the first hole and a sidewall of the second hole; and a conducting layer located on the insulating layer on the substrate and extending onto the sidewall of the first hole, wherein there is substantially no conducting layer in the second hole.

20 Claims, 18 Drawing Sheets

INTERPOSER AND METHOD FOR FORMING THE SAME

CROSS REFERENCE TO RELATED APPLICATIONS

This Application claims the benefit of U.S. Provisional Application No. 61/438,145, filed on Jan. 31, 2011, the entirety of which is incorporated by reference herein.

BACKGROUND OF THE INVENTION

1. Field of the Invention

The invention relates to an interposer, and in particular relates to an interposer having a through substrate conducting structure.

2. Description of the Related Art

An interposer may be used so that other electronic elements, such as printed circuit boards and chips, may be disposed on opposite surfaces thereof. The interposer may also provide a conducting path for signal transmission between the electronic elements.

Because the electronic elements which may be disposed on the interposer may have different structures or characteristics, it has become an important issue to design a novel interposer to meet requirements of electronic elements with different structures or characteristics.

BRIEF SUMMARY OF THE INVENTION

An embodiment of the invention provides an interposer which includes: a substrate having a first surface and a second surface; a first hole extending from the first surface towards the second surface; a second hole extending from the first surface towards the second surface, wherein a width of the first hole is different from a width of the second hole; an insulating layer located on the substrate and extending onto a sidewall of the first hole and a sidewall of the second hole; and a conducting layer located on the insulating layer on the substrate and extending onto the sidewall of the first hole, wherein there is substantially no conducting layer in the second hole.

An embodiment of the invention provides a method for forming an interposer which includes: providing a substrate having a first surface and a second surface; removing a portion of the substrate from the first surface of the substrate to form a first hole extending towards the second surface; removing a portion of the substrate from the first surface of the substrate to form a second hole extending towards the second surface, wherein a width of the first hole is different from a width of the second hole; forming an insulating layer on the substrate, wherein the insulating layer extends onto a sidewall of the first hole and a sidewall of the second hole; and forming a conducting layer on the insulating layer on the substrate, wherein the conducting layer extends onto the sidewall of the first hole, and there is substantially no conducting layer in the second hole.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

An interposer according to an embodiment of the present invention may be used to, for example, carry an electronic chip. For example, the embodiment of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1A:
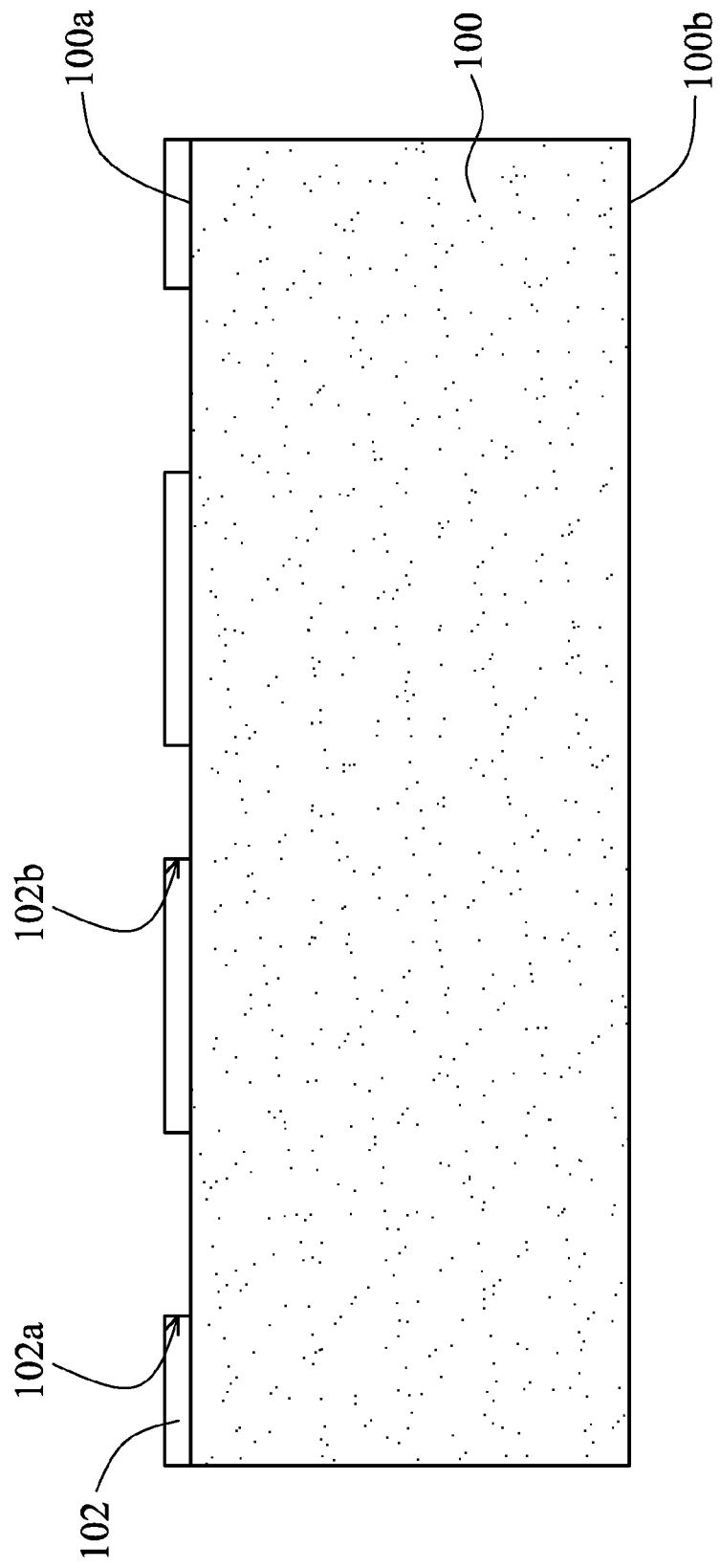
FIGS. 1A-1H are cross-sectional views showing the steps of forming an interposer according to an embodiment of the present invention.

FIGS. 1A-1H are cross-sectional views showing the steps of forming an interposer according to an embodiment of the present invention. As shown in FIG. 1A, a substrate 100 is provided, which has a surface 100a and a surface 100b. The substrate 100 may be, for example, a semiconductor substrate, ceramic substrate, polymer substrate, or combinations thereof. In one embodiment, the substrate 100 is a semiconductor substrate such as a silicon substrate. In one embodiment, the substrate 100 is a semiconductor wafer (such as a silicon wafer), and a wafer-level process may be performed. After the wafer-level process and a subsequent dicing process are performed, a plurality of interposers may be obtained. By using a wafer-level process to form interposers, fabrication time and cost may be reduced.

Then, at least two holes which extend from the surface 100a towards the surface 100b are formed in the substrate 100, wherein widths of the two holes are different. In addition, shapes of openings of the two holes may also be different from each other. For example, the shapes of the openings of the two holes may be (but is not limited to) a circle, square, rectangle, ellipse, polygons, or combinations thereof. In addition, at least one of the two holes may also be a trench.

The two holes mentioned above may be formed by using two photolithography processes and two etching processes, respectively. In another embodiment, the two holes having different widths mentioned above may be simultaneously formed in a same patterning process. For example, as shown in FIG. 1A, a mask layer 102 may be formed on the surface 100a of the substrate 100. A photolithography process may be performed to the mask layer 102 such that the mask layer 102 has an opening 102a and an opening 102b exposing a portion of the substrate 100. A width of the opening 102a is different from a width of the opening 102b, and shapes of the openings may be the same or different from each other. In one embodiment, the width of the opening 102a is larger than the width of the opening 102b (such as that shown in FIG. 1A). In another embodiment, the width of the opening 102a is smaller than the width of the opening 102b.

Figure 1B:
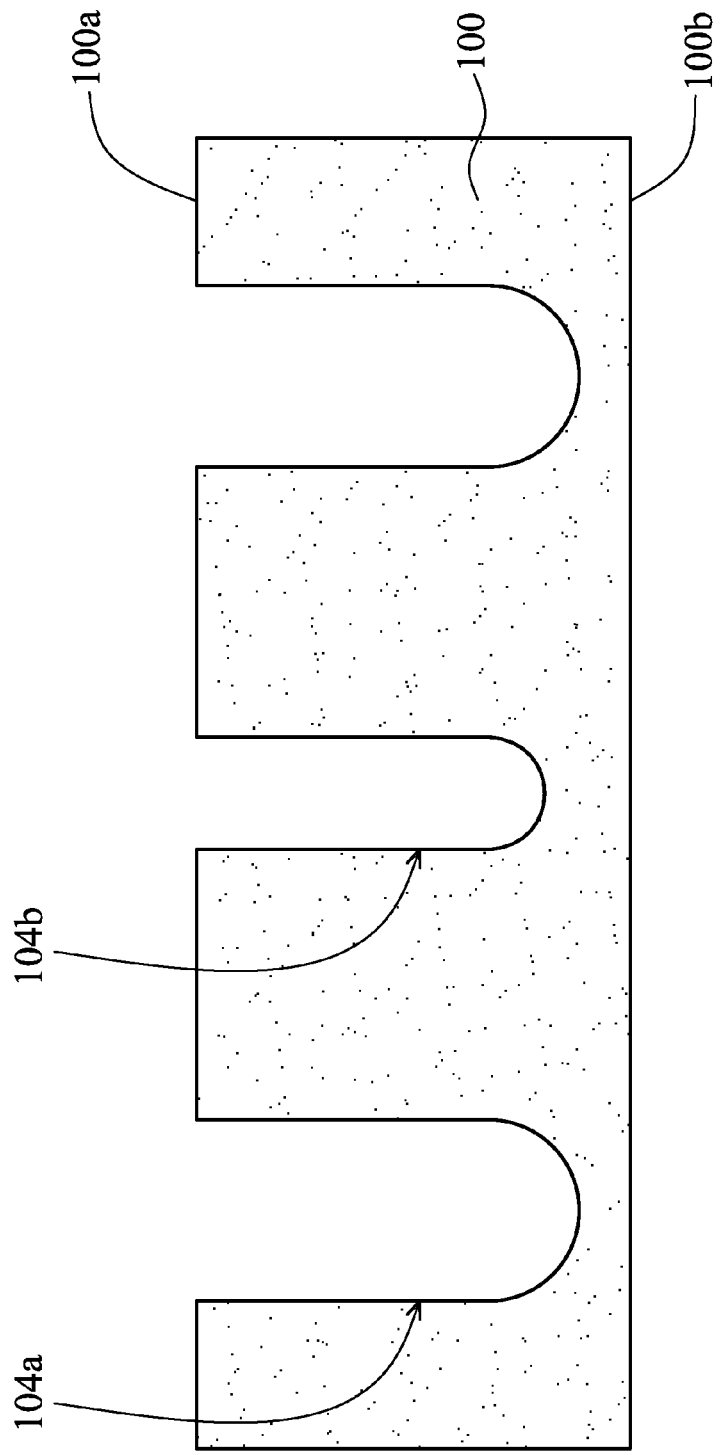

Then, the mask layer 102 may be used as a mask, and an etching process is performed to the surface 100a of the substrate 100 to remove a portion of the substrate 100 and form a hole 104a and a hole 104b which extend towards the surface 100b, as shown in FIG. 1B. Then, the mask layer 102 may be removed. In one embodiment, the hole 104a and the hole 104b may completely penetrate through the substrate 100. In another embodiment, as shown in FIG. 1B, both the hole 104a and the hole 104b do not completely penetrate through the substrate 100. In one embodiment, because the hole 104a corresponds to the larger opening 102a of the mask layer 102, a width of the hole 104a is larger than that of the hole 104b, and a depth of the hole 104a is larger than that of the hole 104b.

Figure 1C:
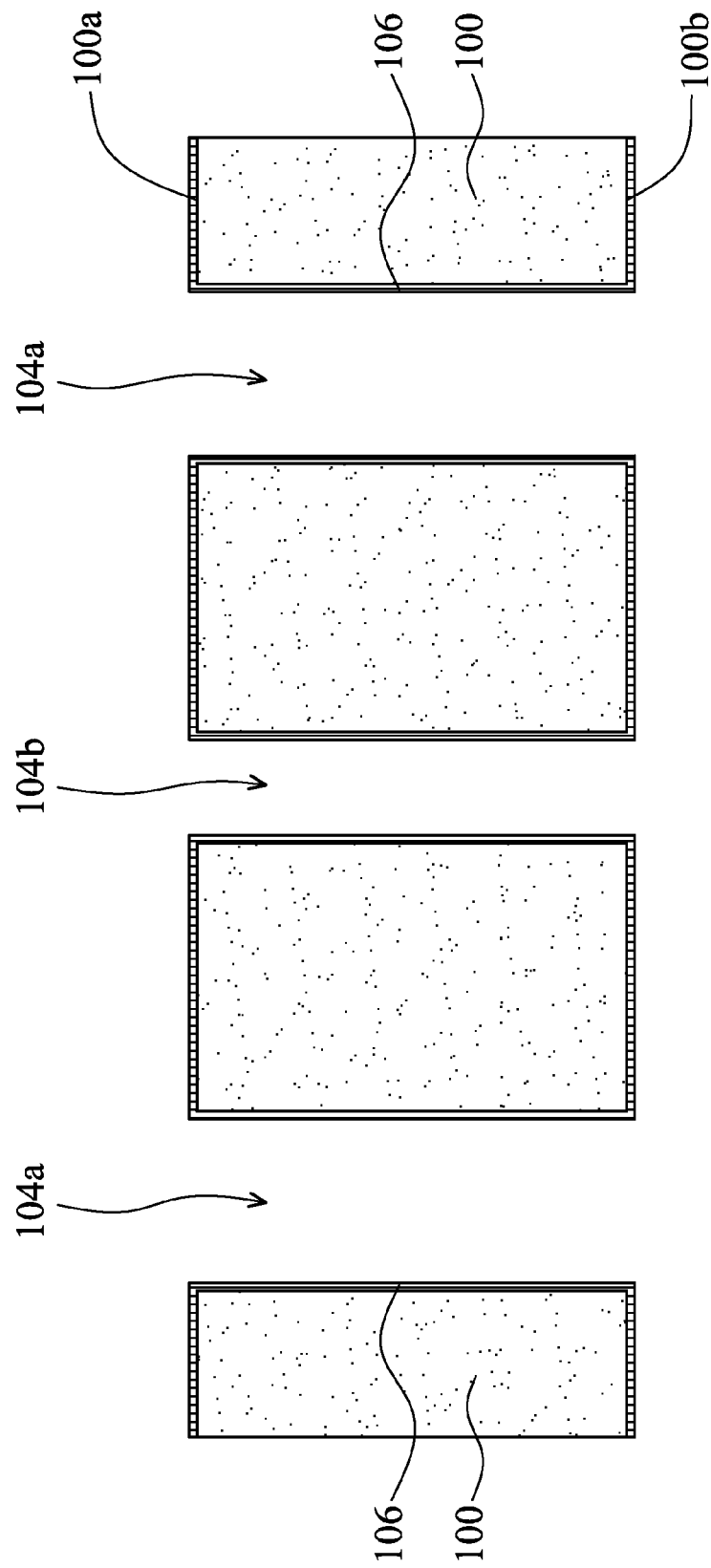

As shown in FIG. 1C, the substrate 100 may be optionally thinned from the surface 100b of the substrate 100 such that the hole 104a and the hole 104b are exposed. In this case, both the hole 104a and the hole 104b become through-holes completely penetrating through the substrate 100.

Then, an insulating layer 106 may be formed on the substrate 100. The insulating layer 106 may be formed on the surface 100a and the surface 100b of the substrate 100. The insulating layer 106 may further extend into the holes 104a and 104b and on the sidewalls of the hole 104a and the hole 104b. A material of the insulating layer 106 may include, for example, (but is not limited to) an epoxy resin, a solder mask material, or other suitable insulating materials, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The formation method of the insulating layer 106 may include (but is not limited to) a coating process, such as a spin coating process, spray coating process, or curtain coating process, or other suitable deposition methods, such as liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition. However, in one embodiment, it should be appreciated that the formation of the insulating layer 106 is not necessary. In the case that no short circuiting issue exists between a subsequently formed conducting layer and the substrate, the insulating layer 106 may not need to be formed.

Figure 3A:
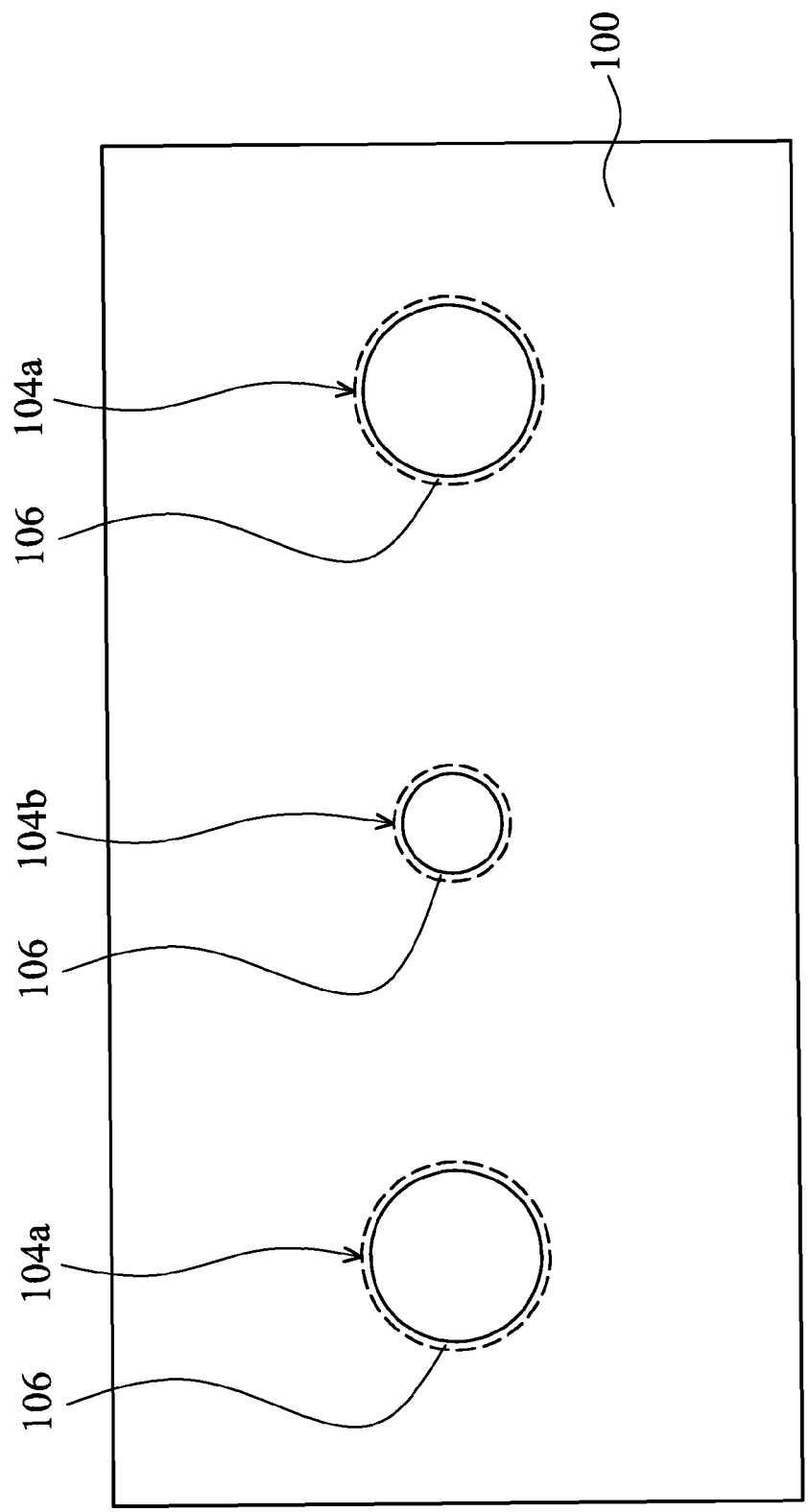
FIGS. 3A-3C are illustrative top views showing interposers according to embodiments of the present invention.
Figure 3B:
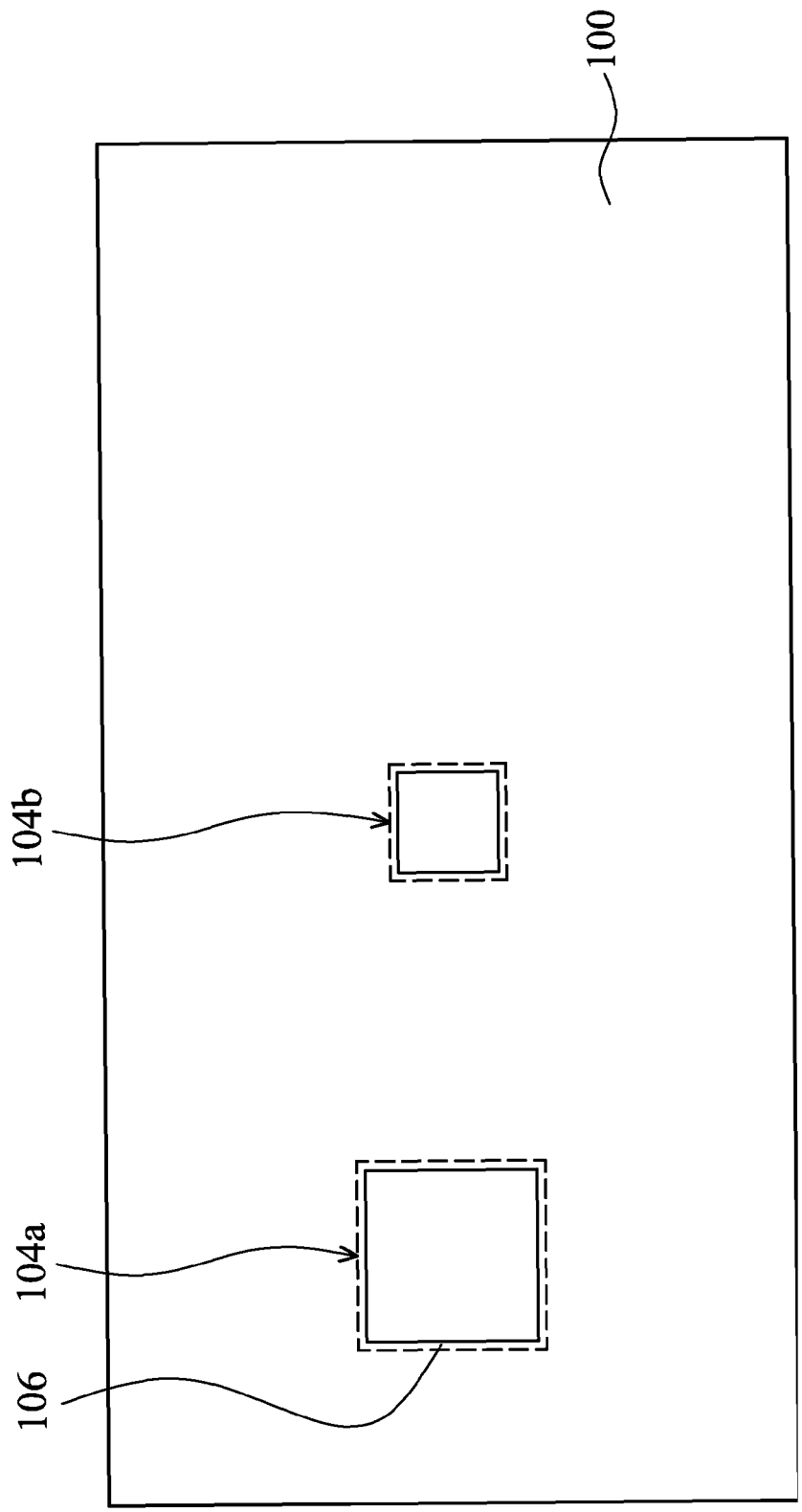
Figure 3C:
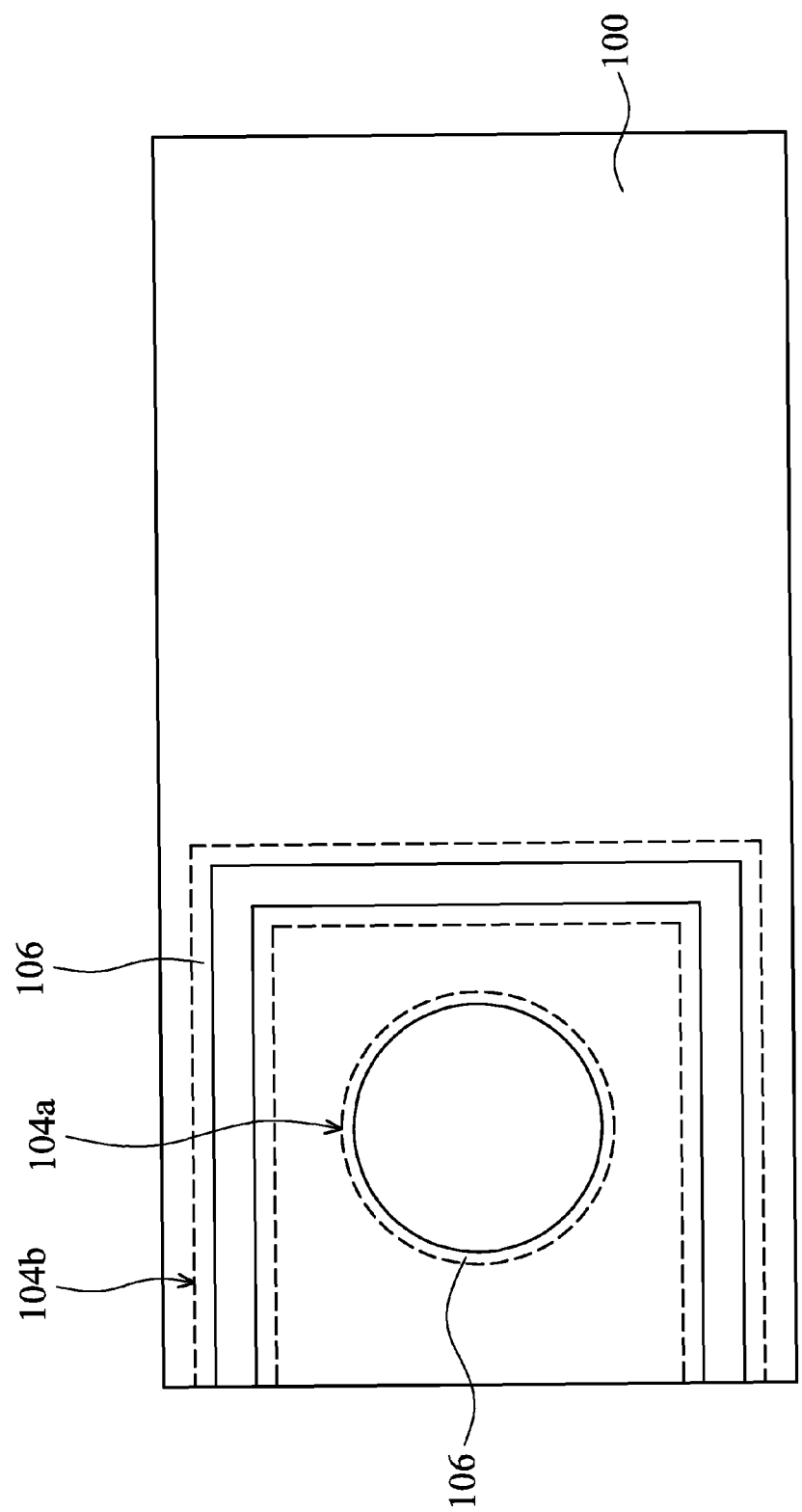

FIGS. 3A-3C are illustrative top views showing interposers according to embodiments of the present invention, which are used to illustrate relationships between the hole 104a and the hole 104b. As shown in FIGS. 3A and 3B, widths of the hole 104a and the hole 104b are different from each other, and shapes of openings of the hole 104a and the hole 104b may have different designs according to the situations. In addition, as shown in FIG. 3C, the hole 104b may be a trench. In one embodiment, the trench (the hole 104b) may surround the hole 104a.

Figure 1D:
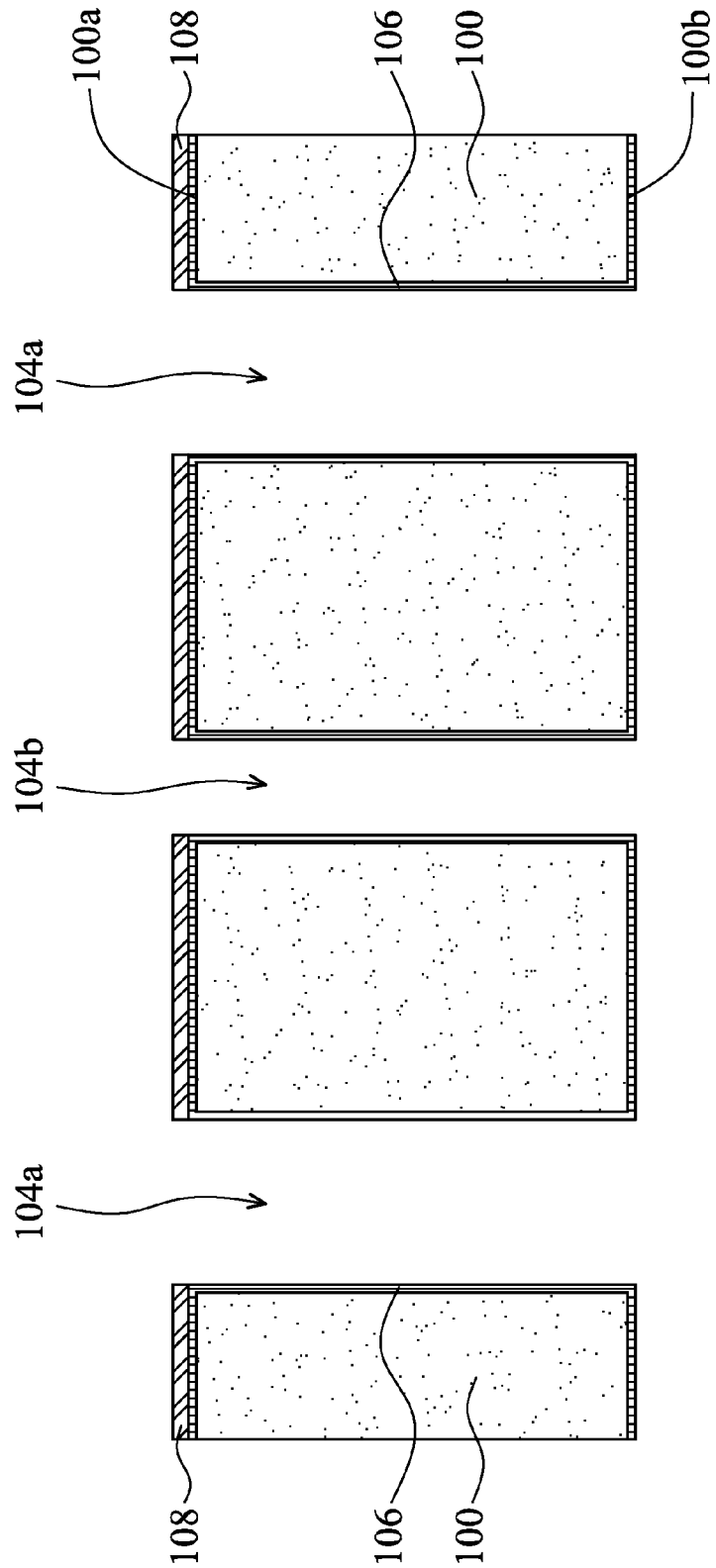

As shown in FIG. 1D, an insulating layer 108 may then be formed on the insulating layer 106. For example, the insulating layer 108 may be formed on the portion of the insulating layer 106 located on the surface 100a of the substrate 100. The insulating layer 108 may improve the insulation effect. For example, in subsequent processes, a conducting path having higher current flow or voltage may be disposed on the insulating layer 108. The insulating layer 108 and the insulating layer 106 may together provide desired insulation. The material and the formation method of the insulating layer 108 may be similar to those of the insulating layer 106. In one embodiment, the thickness of the insulating layer 108 is larger than the thickness of the insulating layer 106. In another embodiment, the material of the insulating layer 108 is different from the material of the insulating layer 106.

Figure 1E:
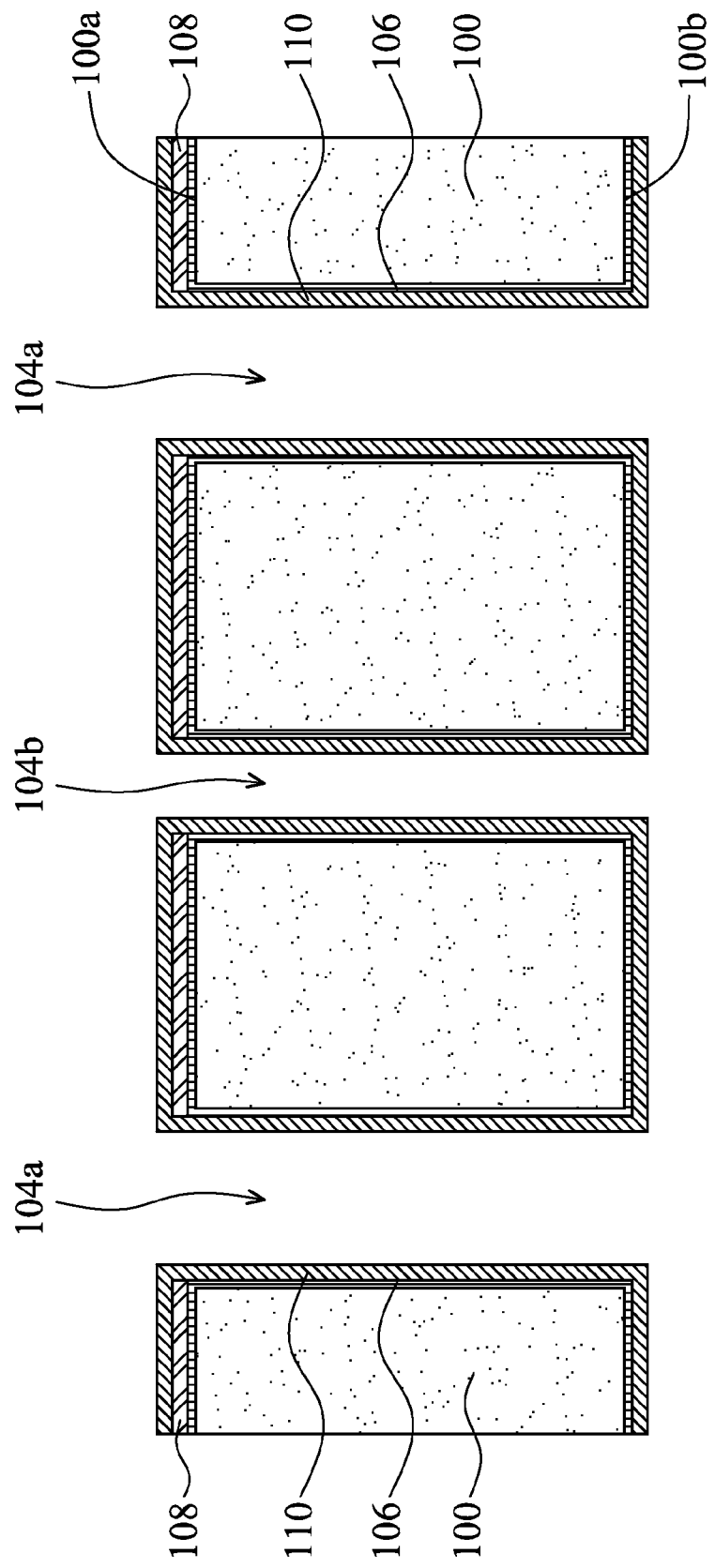

Next, as shown in FIG. 1E, a conducting layer 110 (or called conducting material layer 110) is formed on the insulating layer 106 (and the insulating layer 108). The material of the conducting layer 110 may include (but is not limited to) copper, aluminum, gold, platinum, or the like. The formation method of the conducting layer 110 may include (but is not limited to) a physical vapor deposition process, sputtering process, chemical vapor deposition process, electroplating process, or electroless plating process.

In one embodiment, a seed layer may be formed on the surface 100a and the surface 100b of the substrate 100, the sidewall of the hole 104a, and the sidewall of the hole 104b by using, for example, a sputtering process. Then, a conducting material is electroplated on the seed layer to form the conducting material layer 110. In a subsequent process, the conducting material layer 110 may be further patterned to be a conducting layer having a desired pattern.

Figure 1F:
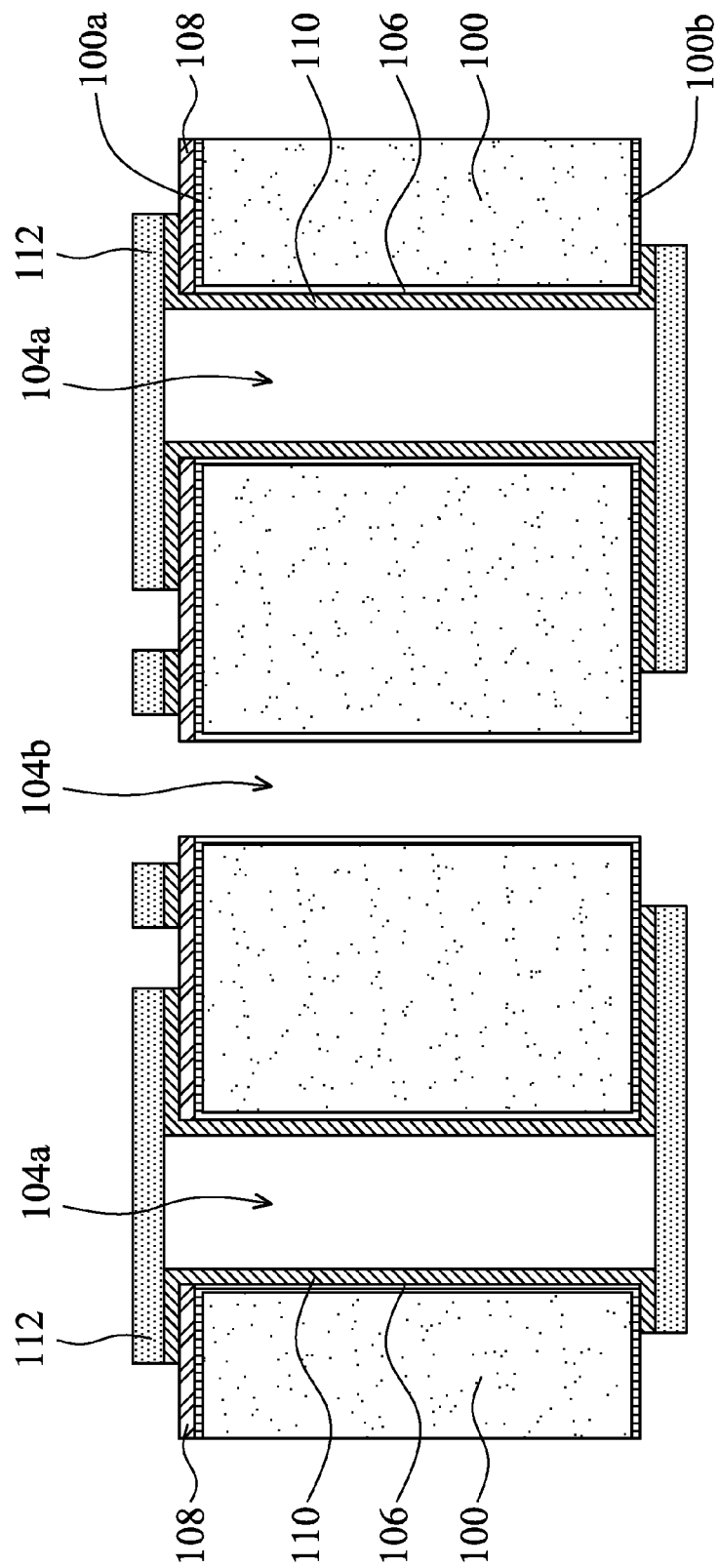

As shown in FIG. 1F, a patterning process of the conducting material layer 110 may then be performed. For example, a mask layer 112 may be formed on the conducting material layer 110. The mask layer 112 may have a plurality of openings exposing a portion of the conducting material layer 110 and the portion of the conducting material layer located on the sidewall of the hole 104b. The mask layer 112 further covers the hole 104a and the conducting material layer 110 therein. Then, the mask layer 112 may be used as a mask, and the exposed conducting material layer is etched to pattern the conducting material layer into the conducting layer 110, as shown in FIG. 1F. In one embodiment, a dry film which substantially does not extend into the hole 104a may be used as the mask layer 112 to facilitate subsequent processes.

Figure 1G:
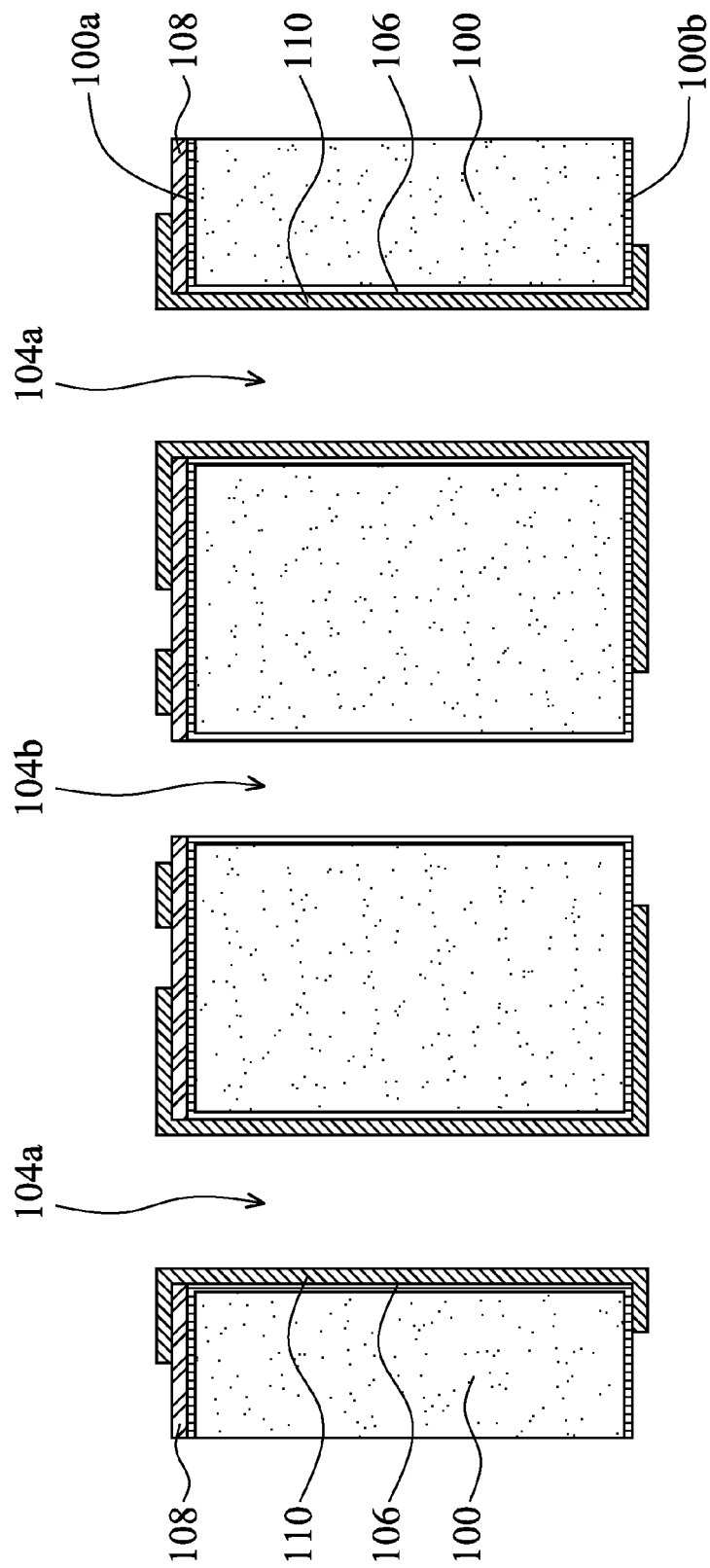

Then, the mask layer 112 may be removed, as shown in FIG. 1G. After the patterning process mentioned above, the conducting layer 110 is located on the insulating layer 106 on the substrate 100 and extended onto the sidewall of the hole 104a, wherein there is substantially no conducting layer in the hole 104b.

Figure 1H:
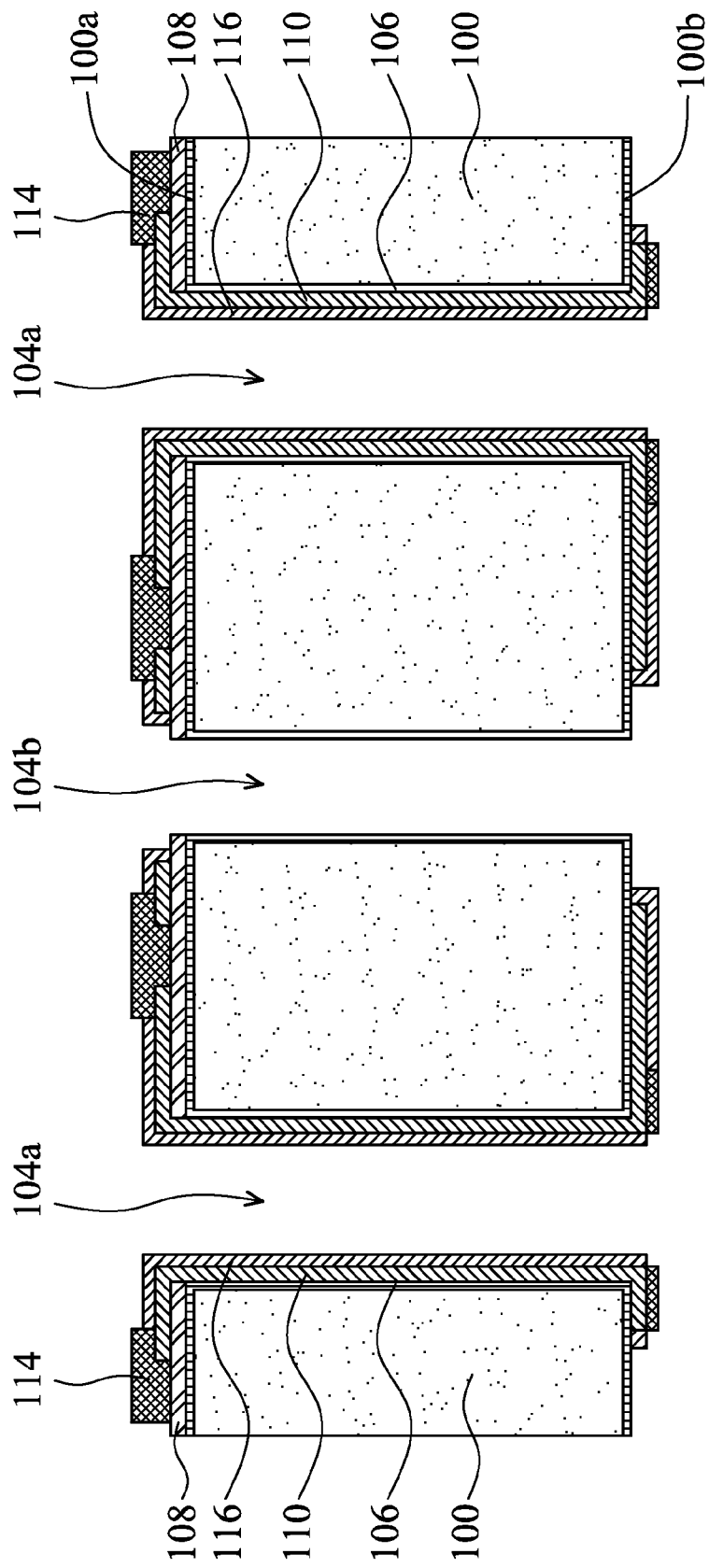

As shown in FIG. 1H, an insulating layer 114 may be optionally formed on the conducting layer 110. The material and the formation method of the insulating layer 114 may be similar to those of the insulating layer 106. The insulating layer 114 may cover a portion of the conducting layer 110 such that another portion of the conducting layer 110 is exposed. The insulating layer 114 may provide, for example, desired protection or insulation.

Then, a conducting layer 116 may be optionally formed on the conducting layer 110 to accomplish fabrication of an interposer according to an embodiment of the invention. In one embodiment, the material of the conducting layer 116 is different from that of the conducting layer 110. The material of the conducting layer 116 may include (but is not limited to) nickel, palladium, gold, or combinations thereof. The formation method of the conducting layer 116 includes, for example, an electroplating process or electroless plating process. In one embodiment, the conducting layer 116 may cover a side of the conducting layer 110, as shown in FIG. 1H. The conducting layer 116 may prevent the conducting layer 110 from being oxidized and may improve bonding between the conducting layer 110 and another electronic element.

The formation method of an interposer according to an embodiment of the invention is not limited to that of the above embodiment. FIGS. 2A-2G are cross-sectional views showing the steps of forming an interposer according to another embodiment of the present invention, wherein same or similar reference numbers are used to designate same or similar elements.

As shown in FIGS. 2A-2D, processes similar to those illustrated in FIGS. 1A-1D may be performed to form holes 104a and 104b in a substrate 100, which extend from a surface 100a towards a surface 100b, and a width of the hole 104a is different from that of the hole 104b. An insulating layer 106 and an insulating layer 108 may be formed on the substrate 100, wherein the insulating layer 106 may extend onto the sidewalls of the hole 104a and the hole 104b.

Figure 2A:
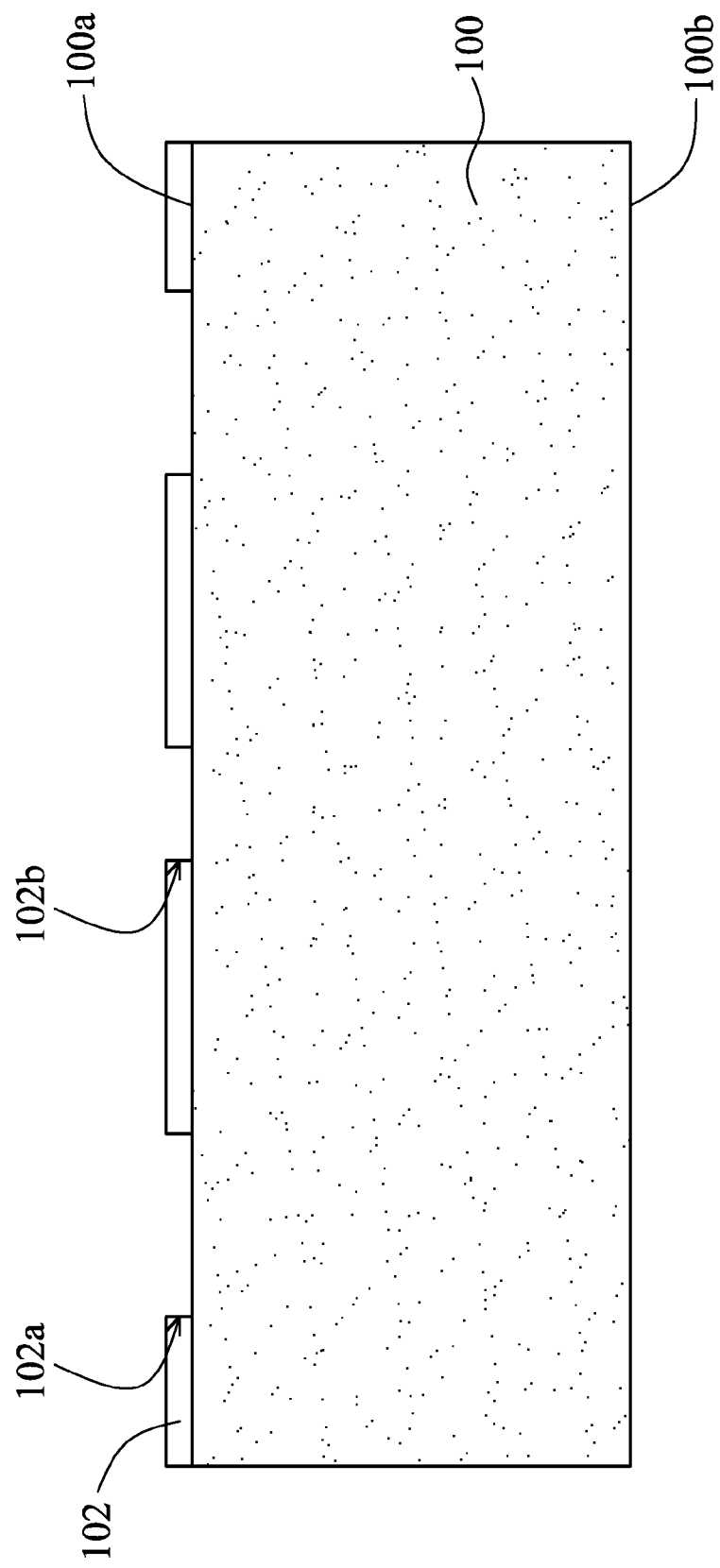
FIGS. 2A-2G are cross-sectional views showing the steps of forming an interposer according to an embodiment of the present invention.
Figure 2B:
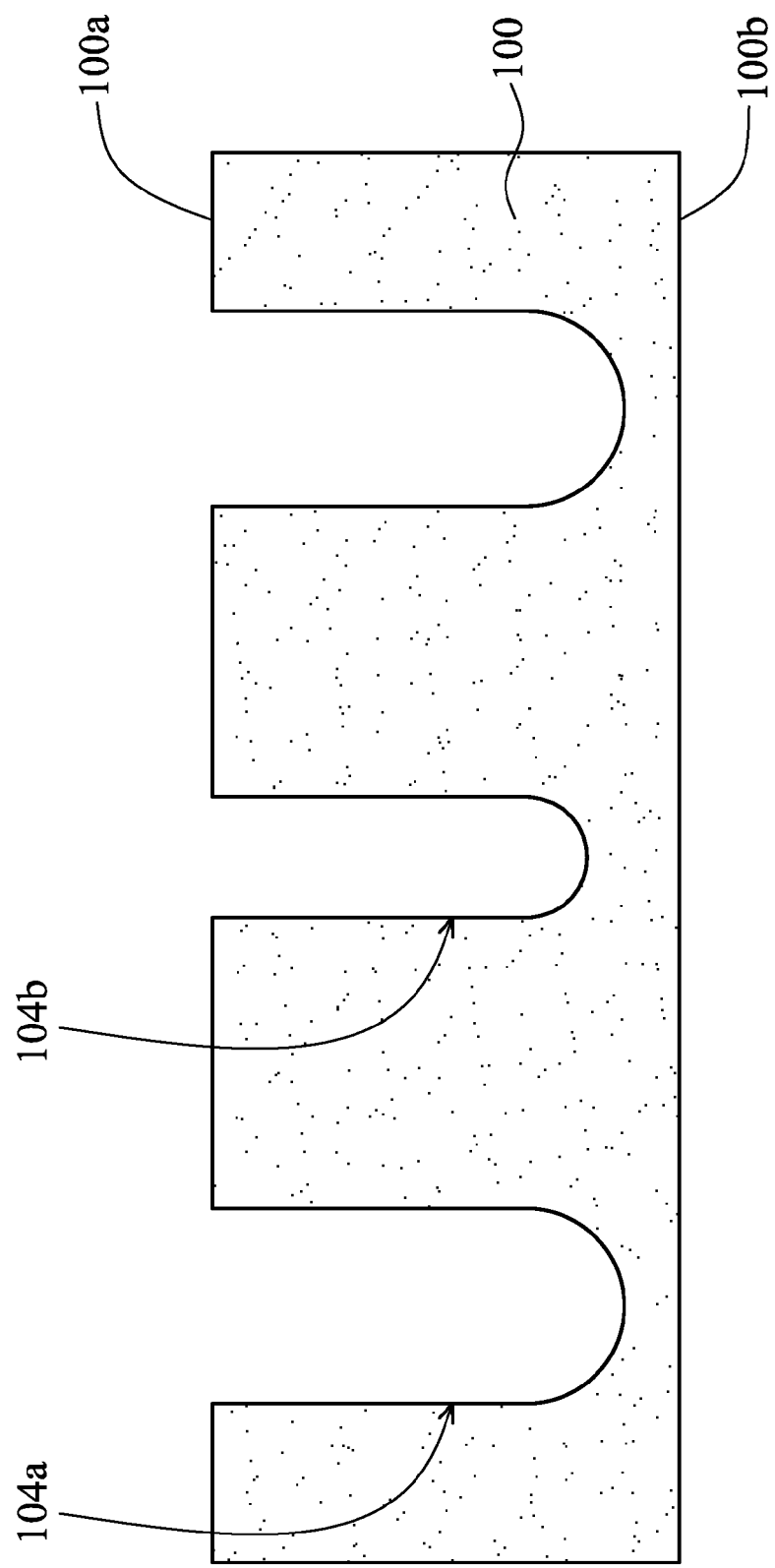
Figure 2C:
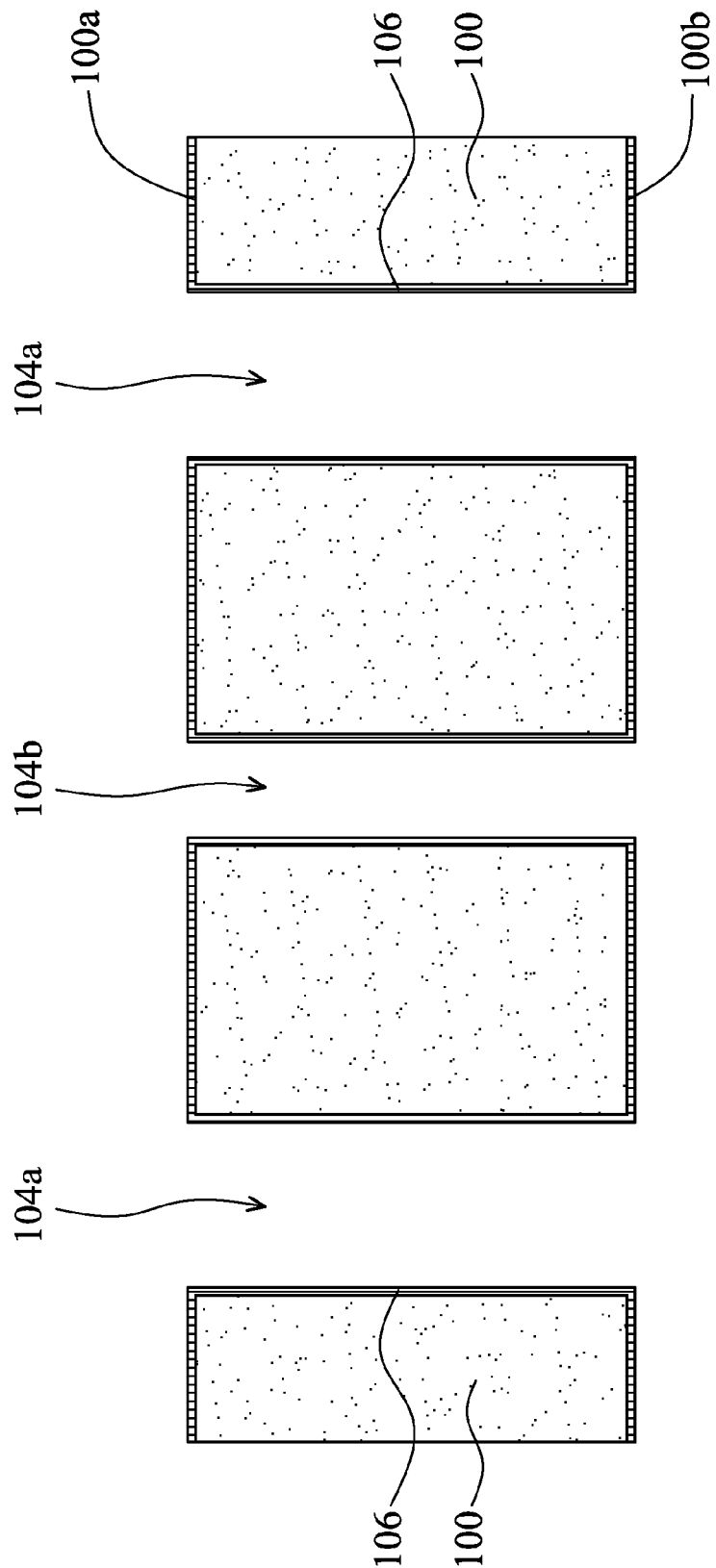
Figure 2D:
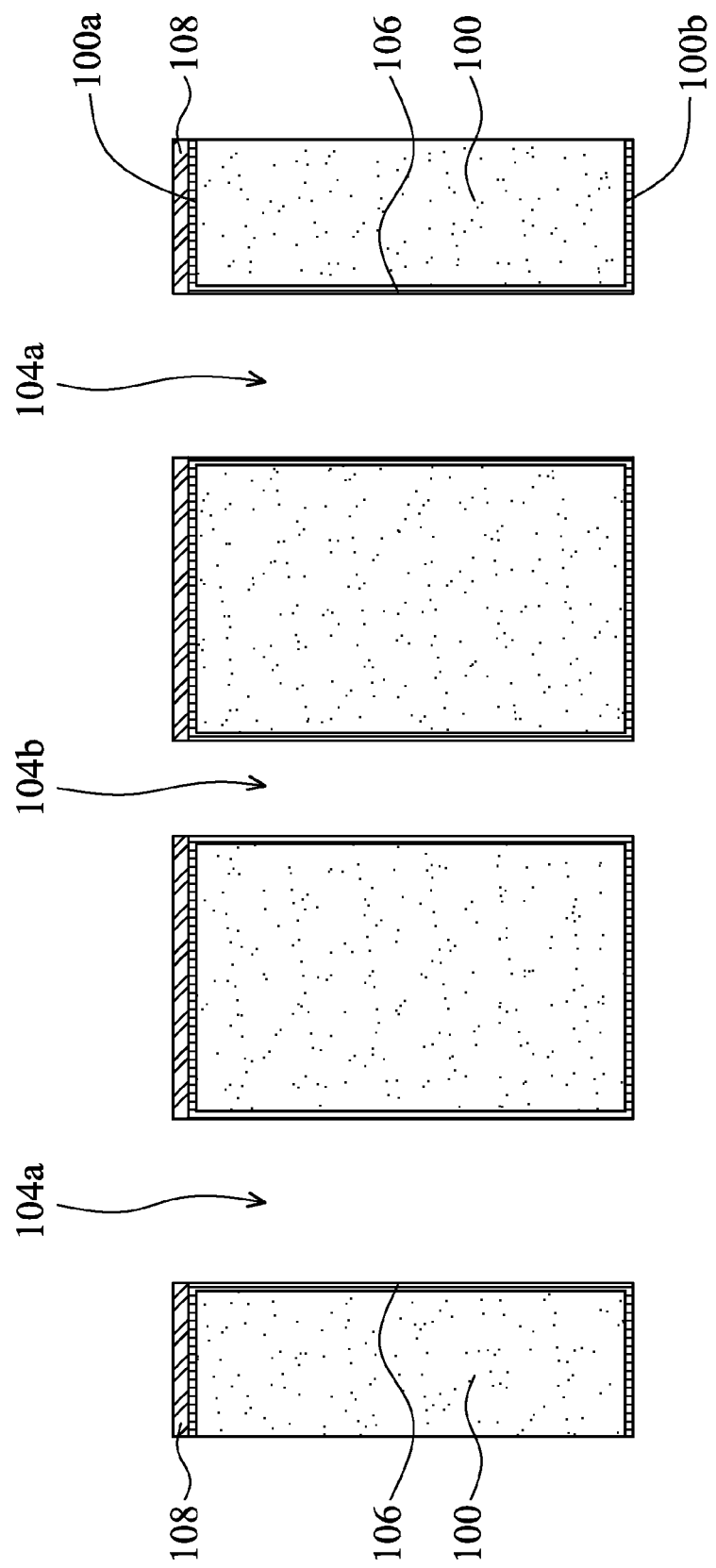
Figure 2E:
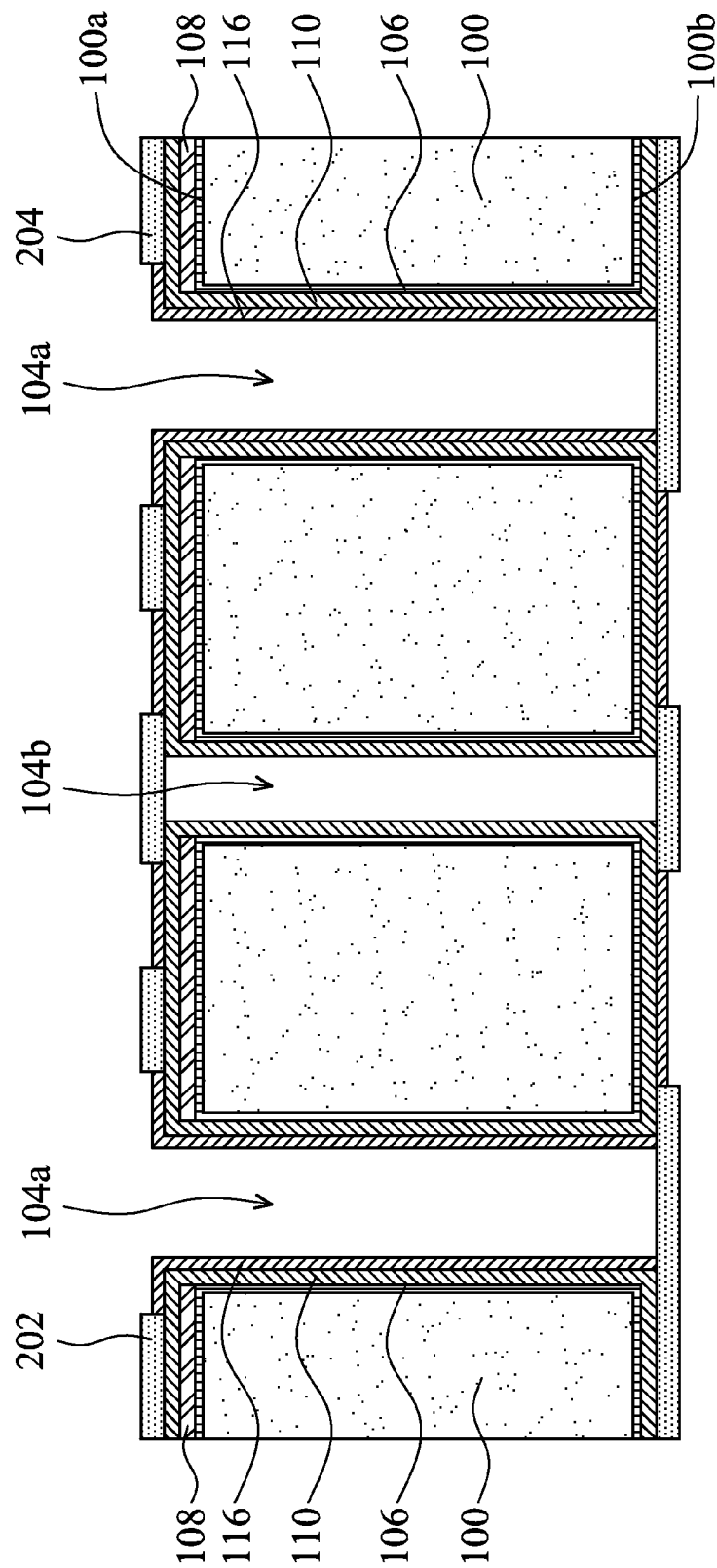

Next, as shown in FIG. 2E, a conducting layer 110 (or called a conducting material layer 110) is formed on the surface 100a and the surface 100b of the substrate, the sidewall of the hole 104a, and the sidewall of the hole 104b. Then, a mask layer 202 is formed on the conducting material layer 110. The mask layer 202 may have a plurality of openings exposing a portion of the conducting material layer 110 and the portion of the conducting material layer located on the sidewall of the hole 104a, and the mask layer 202 covers the hole 104b. Then, a conducting layer 116 is formed on the surface of the conducting material layer 110 which is not covered by the mask layer 202.

Figure 2F:
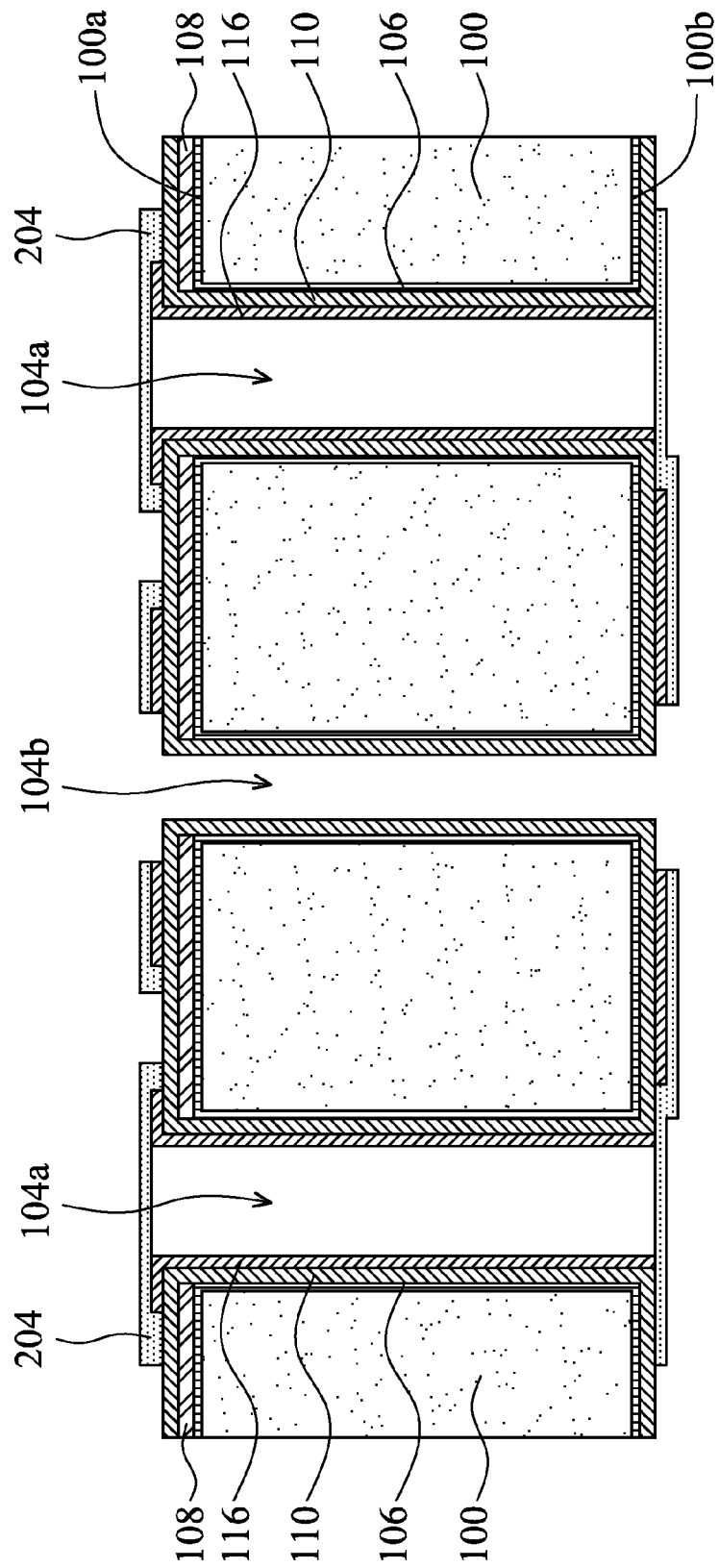

Next, as shown in FIG. 2F, the mask layer 202 is removed, and another mask layer 204 is formed on the conducting material layer 110 and the conducting layer 116. The mask layer 204 has a plurality of openings exposing a portion of the conducting material layer 110 and the portion of the conducting layer 116 located on the sidewall of the hole 104b. The mask layer 204 further covers the hole 104a and the conducting material layer 110 and the conducting layer 116 therein.

Figure 2G:
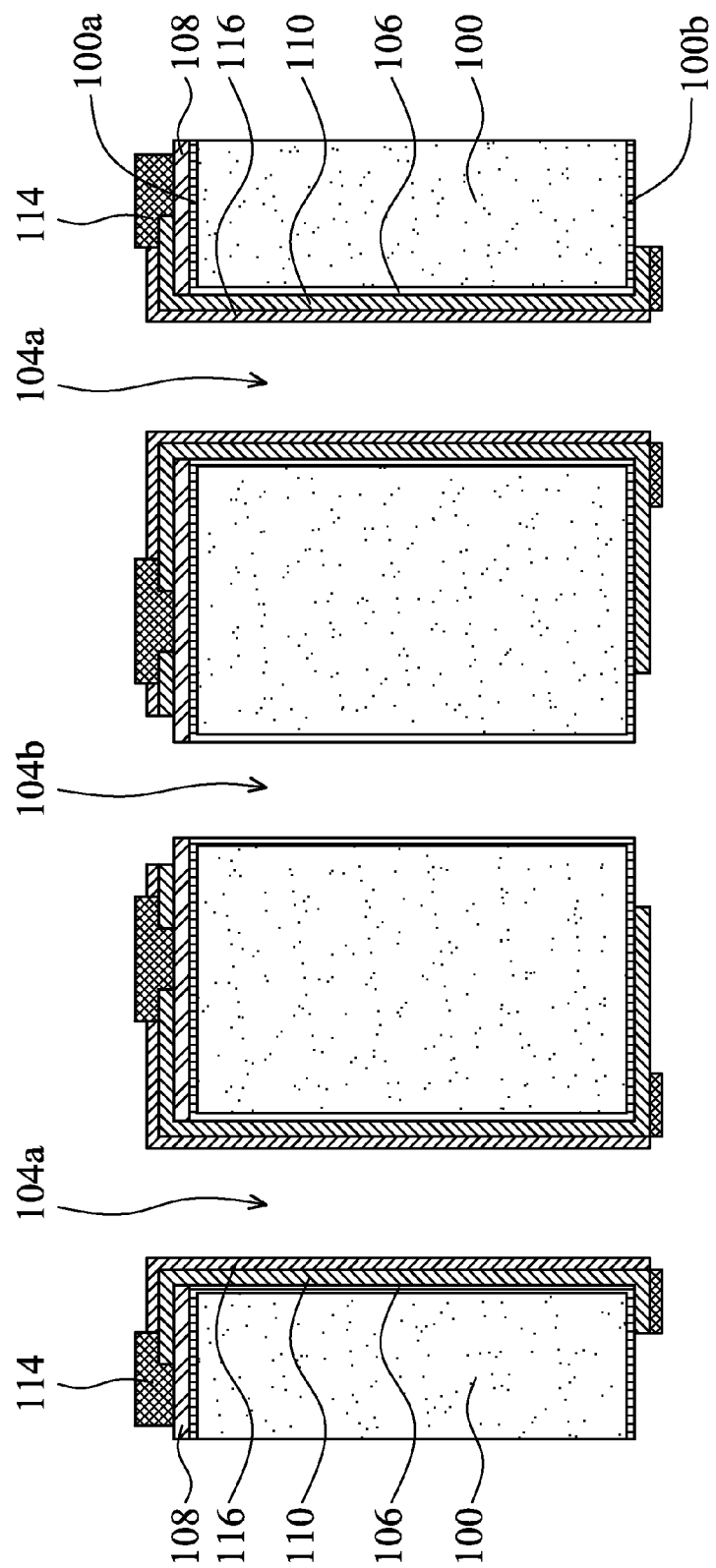

As shown in FIG. 2G, the mask layer 204 may then be used as a mask, and the exposed conducting material layer 110 is etched to be patterned. Then, the mask layer 204 is removed, as shown in FIG. 2G. The patterned conducting layer 110 is located on the insulating layer 106 on the substrate 100 and extended onto the sidewall of the hole 104a, wherein there is substantially no conducting layer in the hole 104b. In this embodiment, it should be appreciated that the conducting layer 116 does not cover the side of the conducting layer 110. In one embodiment, the side of the conducting layer 116 is substantially coplanar with the side of the conducting layer 110, as shown in FIG. 2G.

Then, an insulating layer 114 may be optionally formed on the conducting layer 110 to accomplish fabrication of an interposer according to an embodiment of the invention. The insulating layer 114 covers the surface of the conducting layer 110 which is not covered by the conducting layer 116.

The interposer according to the embodiment of the invention may have at least two through-holes having different widths, and there is substantially no conducting layer but only the insulating layer in one of the through-holes. In one embodiment, the through-hole having a different width and having no conducting layer therein may, for example, be used for alignment. In another embodiment, the hole 104b and the insulating layer 106 may be used as a through substrate insulating structure which may, for example, surround a through substrate conducting structure constructed by the hole 104a, the insulating layer 106, the conducting layer 110, and the conducting layer 116. In yet another embodiment, the through substrate insulating structure may block light such that light is not transmitted to another region.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interposer, comprising:
   a substrate having a first surface and a second surface;
   a first hole extending from the first surface towards the second surface of the substrate;
   a second hole extending from the first surface towards the second surface of the substrate, wherein a width of the first hole is different from a width of the second hole;
   an insulating layer located on the substrate and extending onto a sidewall of the first hole and a sidewall of the second hole without filling the first and second holes; and
   a conducting layer located on the insulating layer on the substrate and extending onto the sidewall of the first hole without filling the first hole, wherein there is substantially no conducting layer in the second hole.

2. The interposer as claimed in claim 1, wherein the width of the first hole is different from the width of the second hole.

3. The interposer as claimed in claim 1, further comprising a second insulating layer located between the conducting layer and the insulating layer.

4. The interposer as claimed in claim 1, further comprising a second conducting layer covering a surface of the conducting layer.

5. The interposer as claimed in claim 1, further comprising a third insulating layer covering a portion of the conducting layer.

6. The interposer as claimed in claim 3, wherein the second insulating layer is located on the first surface of the substrate.

7. The interposer as claimed in claim 3, wherein a thickness of the second insulating layer is larger than a thickness of the insulating layer.

8. The interposer as claimed in claim 4, further comprising a third insulating layer covering a portion of the conducting layer, wherein the second conducting layer covers another portion of the conducting layer.

9. The interposer as claimed in claim 4, wherein the second conducting layer covers a side of the conducting layer.

10. The interposer as claimed in claim 4, wherein a side of the second conducting layer is substantially coplanar with a side of the conducting layer.

11. The interposer as claimed in claim 4, wherein a material of the second conducting layer is different from a material of the conducting layer.

12. A method for forming an interposer, comprising:
    providing a substrate having a first surface and a second surface;
    removing a portion of the substrate from the first surface of the substrate to form a first hole extending towards the second surface;
    removing a portion of the substrate from the first surface of the substrate to form a second hole extending towards the second surface, wherein a width of the first hole is different from a width of the second hole;
    forming an insulating layer on the substrate, wherein the insulating layer extends onto a sidewall of the first hole and a sidewall of the second hole without filling the first and second holes; and
    forming a conducting layer on the insulating layer on the substrate, wherein the conducting layer extends onto the sidewall of the first hole without filling the first hole, and there is substantially no conducting layer in the second hole.

13. The method for forming an interposer as claimed in claim 12, wherein the steps of forming the first hole and the second hole comprises:
    forming a mask layer on the first surface of the substrate, wherein the mask layer has a first opening and a second opening each exposing a portion of the substrate, wherein a width of the first opening is different from a width of the second opening;
    using the mask layer as a mask to etch the exposed substrate to form the first hole and the second hole; and
    removing the mask layer.

14. The method for forming an interposer as claimed in claim 12, further comprising forming a second insulating layer between the conducting layer and the insulating layer.

15. The method for forming an interposer as claimed in claim 12, wherein the step of forming the conducting layer comprises:
    forming a conducting material layer on the first surface and the second surface of the substrate, the sidewall of the first hole, and the sidewall of the second hole;
    forming a second mask layer on the conducting material layer, wherein the second mask layer has a plurality of openings exposing a portion of the conducting material layer and a portion of the conducting material layer located on the sidewall of the second hole, and the second mask layer covers the first hole;
    using the second mask layer as a mask to etch the exposed conducting material layer to pattern the conducting material layer into the conducting layer; and
    removing the second mask layer.

16. The method for forming an interposer as claimed in claim 12, further comprising forming a second conducting layer on the conducting layer, wherein the steps of forming the conducting layer and the second conducting layer comprise:
    forming a conducting material layer on the first surface and the second surface of the substrate, the sidewall of the first hole, and the sidewall of the second hole;
    forming a third mask layer on the conducting material layer, wherein the third mask layer has a plurality of openings exposing a portion of the conducting material layer and a portion of the conducting material layer located on the sidewall of the first hole, and the third mask layer covers the second hole;
    forming the second conducting layer on a surface of the conducting material layer not covered by the third mask layer;
    removing the third mask layer;
    forming a fourth mask layer on the conducting material layer and the second conducting layer, wherein the fourth mask layer has a plurality of openings exposing a portion of the conducting material layer and a portion of the conducting material layer located on the sidewall of the second hole, and the fourth mask layer covers the first hole;
    using the fourth mask layer as a mask to etch the exposed conducting material layer to pattern the conducting material layer into the conducting layer; and
    removing the fourth mask layer.

17. The method for forming an interposer as claimed in claim 13, further comprising thinning the substrate from the second surface of the substrate such that the first hole and the second hole are exposed.

18. The method for forming an interposer as claimed in claim 15, further comprising forming a second conducting layer on a surface of the conducting layer, wherein the second conducting layer covers a side of the conducting layer.

19. The method for forming an interposer as claimed in claim 18, before the second conducting layer is formed, further comprising forming a third insulating layer on the conducting layer, wherein the third insulating layer covers a portion of the conducting layer, and the second conducting layer is formed on a surface of the conducting layer not covered by the third insulating layer.

20. The method for forming an interposer as claimed in claim 16, further comprising forming a third insulating layer on the conducting layer, wherein the third insulating layer covers a surface of the conducting layer not covered by the second conducting layer.

* * * * *